(12) United States Patent
Hikosaka et al.

(10) Patent No.: US 8,368,104 B2
(45) Date of Patent: Feb. 5, 2013

(54) LIGHT EMITTING DEVICE

(75) Inventors: Toshiki Hikosaka, Tokyo (JP);
Takahiro Sato, Kanagawa-ken (JP);
Iwao Mitsuishi, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 258 days.

(21) Appl. No.: 12/874,413

(22) Filed: Sep. 2, 2010

(65) Prior Publication Data

US 2011/0147775 A1 Jun. 23, 2011

(30) Foreign Application Priority Data

Dec. 22, 2009 (JP) ................. 2009-290554

(51) Int. Cl.
*H01L 33/00* (2010.01)
(52) U.S. Cl. ...... 257/98; 257/99; 257/100; 257/E33.067
(58) Field of Classification Search .............. 257/98, 257/99, 100, E33.067
See application file for complete search history.

(56) References Cited

U.S. PATENT DOCUMENTS

| | | | |
|---|---|---|---|
| 2007/0228390 A1 | 10/2007 | Hattori et al. | |
| 2009/0058256 A1 | 3/2009 | Mitsuishi et al. | |
| 2009/0295265 A1 | 12/2009 | Tabuchi et al. | |

FOREIGN PATENT DOCUMENTS

| | | |
|---|---|---|
| CN | 1523683 A | 8/2004 |
| JP | 2001-210874 | 8/2001 |
| JP | 2006-352085 | 12/2006 |
| JP | 4254266 B2 | 4/2009 |
| JP | 2009-267289 | 11/2009 |
| KR | 10-2004-0075738 | 8/2004 |
| KR | 10-2007-0089194 | 6/2007 |

OTHER PUBLICATIONS

Office Action issued Jan. 26, 2012 in Japanese Patent Application No. 2009-290554 (with English translation).
U.S. Appl. No. 13/037,838, filed Mar. 1, 2011, Matsuda, et al.
Office Action issued Oct. 21, 2011, in Korean Patent Application No. 10-2010-88043 with English translation.
U.S. Appl. No. 12/874,839, filed Sep. 2, 2010, Hikosaka, et al.
Korean Office Action issued May 27, 2012 in patent application No. 10-2010-86043 with English translation.
Office Action issued Oct. 31, 2012, in Chinese Patent Application No. 201010274434.2, (with English-language Translation).

*Primary Examiner* — Tan N Tran
(74) *Attorney, Agent, or Firm* — Oblon, Spivak, McClelland, Maier & Neustadt, L.L.P.

(57) ABSTRACT

According to one embodiment, a light emitting device includes a semiconductor light emitting element to emit a first light, a mounting member, first and second wavelength conversion layers and a transparent layer. The first wavelength conversion layer is provided between the element and the mounting member in contact with the mounting member. The first wavelength conversion layer absorbs the first light and emits a second light having a wavelength longer than a wavelength of the first light. The semiconductor light emitting element is disposed between the second wavelength conversion layer and the first wavelength conversion layer. The second wavelength conversion layer absorbs the first light and emits a third light having a wavelength longer than the wavelength of the first light. The transparent layer is provided between the element and the second wavelength conversion layer. The transparent layer is transparent to the first, second, and third lights.

20 Claims, 7 Drawing Sheets

US 8,368,104 B2

LIGHT EMITTING DEVICE

CROSS-REFERENCE TO RELATED APPLICATIONS

This application is based upon and claims the benefit of priority from the prior Japanese Patent Application No. 2009-290554, filed on Dec. 22, 2009; the entire contents of which are incorporated herein by reference.

FIELD

Embodiments described herein relate generally to a light emitting device.

BACKGROUND

White LED light emitting devices that emit white light by combining a fluorescer with a semiconductor light emitting element such as a blue LED have been developed as small light emitting devices having low power consumption.

JP-A 2001-210874 (Kokai) discusses a configuration in which an LED chip including a substrate and a fluorescer layer provided beforehand on the lower face of the substrate is mounted on a leadframe and a fluorescer is coated onto the surface of the LED chip. However, the efficiency cannot be increased sufficiently for such a configuration. Further, the heat dissipation is poor because the fluorescer layer and a die bonding adhesive are provided between the LED chip and the leadframe; the luminous efficacy decreases due to heat generation; and the reliability undesirably decreases.

Despite the increasing need for higher efficiency of light emitting devices, the efficiency cannot be increased sufficiently by conventional art.

DETAILED DESCRIPTION

Figure 1:
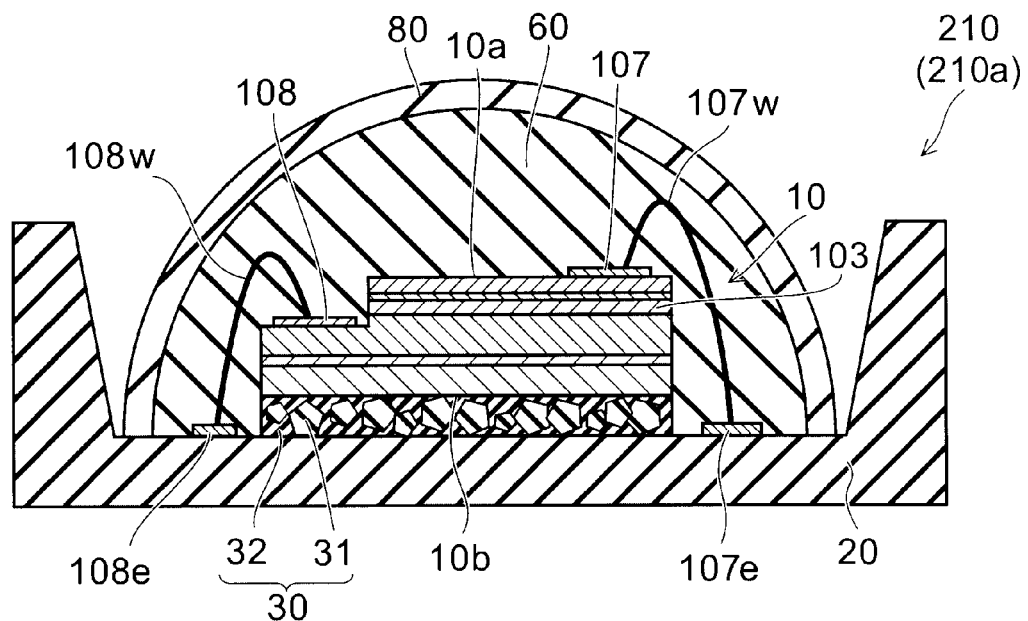
FIG. 1 is a schematic cross-sectional view illustrating a light emitting device.

In general, according to one embodiment, a light emitting device includes a semiconductor light emitting element, a mounting member, a first wavelength conversion layer, a second wavelength conversion layer, and a first transparent layer. The semiconductor light emitting element emits a first light. The semiconductor light emitting element is placed on the mounting member. The first wavelength conversion layer is provided between the semiconductor light emitting element and the mounting member in contact with the mounting member. The first wavelength conversion layer absorbs the first light emitted and emits a second light having a wavelength longer than a wavelength of the first light. The semiconductor light emitting element is disposed between at least a part of the second wavelength conversion layer and the first wavelength conversion layer. The second wavelength conversion layer absorbs the first light and emits a third light having a wavelength longer than the wavelength of the first light. The first transparent layer is provided between the semiconductor light emitting element and the second wavelength conversion layer. The first transparent layer is transparent to the first light, the second light, and the third light.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings of the application, components similar to those described in regard to a drawing thereinabove are marked with like reference numerals, and a detailed description is omitted as appropriate.

First Embodiment

FIG. 1 is a schematic cross-sectional view illustrating the configuration of a light emitting device according to a first embodiment of the invention.

Figure 2:
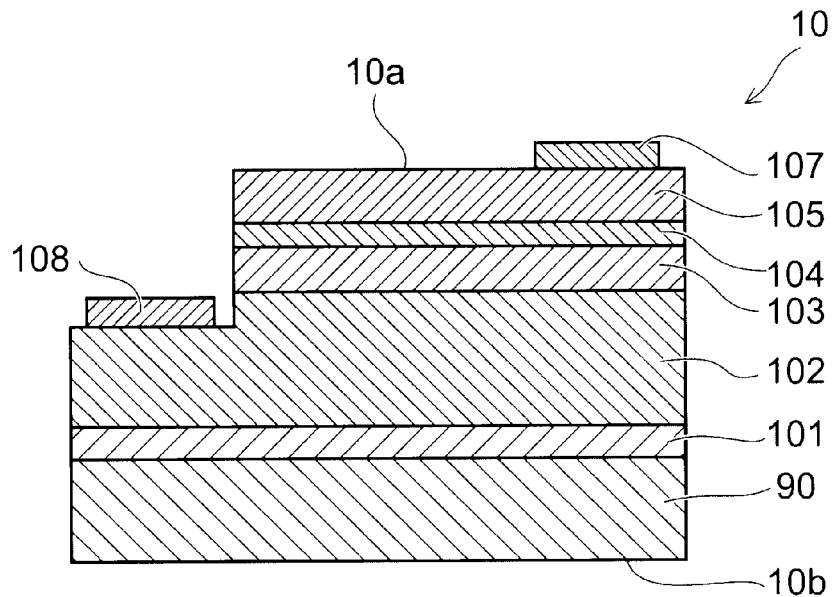
FIG. 2 is a schematic cross-sectional view illustrating a semiconductor light emitting element used in the light emitting device.

FIG. 2 is a schematic cross-sectional view illustrating the configuration of a semiconductor light emitting element used in the light emitting device according to the first embodiment of the invention.

As illustrated in FIG. 1, the light emitting device 210 according to this embodiment includes the semiconductor light emitting element 10, a mounting member 20, a first wavelength conversion layer 30, a second wavelength conversion layer 80, and a first transparent layer 60.

The semiconductor light emitting element 10 is placed on the mounting member 20. The first wavelength conversion layer 30 is provided between the semiconductor light emitting element 10 and the mounting member 20 in contact with the mounting member 20. The first wavelength conversion layer 30 absorbs a first light emitted from the semiconductor light emitting element 10 and emits a second light having a wavelength longer than the wavelength of the first light. In other words, the wavelength band of the second light is longer than the wavelength band of the first light. For example, the shortest wavelength of the wavelength band of the second light is longer than the shortest wavelength of the wavelength band of the first light. For example, the longest wavelength of the wavelength band of the second light is longer than the longest wavelength of the wavelength band of the first light. For example, the shortest wavelength of the wavelength band of the second light is longer than the longest wavelength of the wavelength band of the first light. For example, the peak wavelength of the second light is longer than the peak wavelength of the first light.

The second wavelength conversion layer 80 is provided on the side of the semiconductor light emitting element 10 opposite to the first wavelength conversion layer 30, absorbs the first light. Namely, the semiconductor light emitting element 10 is disposed between at least a part of the second wavelength conversion layer 80 and the first wavelength conversion layer 30. The second wavelength conversion layer 80 emits a third light having a wavelength longer than the wavelength of the first light. In other words, the wavelength band of the third light is longer than the wavelength band of the first light. For example, the shortest wavelength of the wavelength band of the third light is longer than the shortest wavelength of the wavelength band of the first light. For example, the longest wavelength of the wavelength band of the third light is longer than the longest wavelength of the wavelength band of the first light. For example, the shortest wavelength of the wavelength band of the third light is longer than the longest wavelength of the wavelength band of the first light. For example, the peak wavelength of the third light is longer than the peak wavelength of the first light. The third light may have a wavelength characteristic substantially the same as that of the second light or different from that of the second light. The second wavelength conversion layer 80 further absorbs the second light; and the third light thereby emitted from the second wavelength conversion layer 80 may have a wavelength characteristic different from those of the first light and the second light.

The first transparent layer 60 is provided between the semiconductor light emitting element 10 and the second wavelength conversion layer 80 and is transparent to the first light, the second light, and the third light.

As illustrated in FIG. 2, the semiconductor light emitting element 10 includes a stacked structural body including a buffer layer 101, an n-type contact layer 102, a light emitting layer 103, a p-type electron blocking layer 104, and a p-type contact layer 105 stacked sequentially on a substrate 90. The buffer layer 101 may include, for example, polycrystalline GaN; and the n-type contact layer 102 may include, for example, GaN doped with Si. The light emitting layer 103 may have, for example, a quantum well structure in which a barrier layer and a well layer are multiply stacked alternately. The barrier layer may include, for example, GaN; and the well layer may include, for example, InGaN. The p-type electron blocking layer 104 may include, for example, AlGaN doped with Mg. The p-type contact layer 105 may include, for example, GaN doped with Mg.

In the stacked structural body of the semiconductor light emitting element 10 of this specific example, a portion of the n-type contact layer 102 and a portion of the light emitting layer 103, the p-type electron blocking layer 104, and the p-type contact layer 105 are removed; and a portion of the n-type contact layer 102 is exposed. An n-side electrode 108 is further provided to connect to the n-type contact layer 102; and a p-side electrode 107 is further provided to connect to the p-type contact layer 105. In other words, the p-side electrode 107 is provided on a first major surface 10a of the semiconductor light emitting element 10 on the p-type semiconductor layer (the p-type contact layer 105) side in contact with the p-type semiconductor layer (the p-type contact layer 105). A second major surface 10b of the semiconductor light emitting element 10 on the n-type semiconductor layer (the n-type contact layer 102) side is the face on the side opposing the mounting member 20.

Each of the semiconductor layers of the semiconductor light emitting element 10 may include a nitride semiconductor. In other words, the semiconductor light emitting element 10 may include, for example, a blue light emitting diode (LED), a bluish-violet LED, a violet LED, an ultraviolet LED, etc. However, the embodiments of the invention are not limited thereto. Any semiconductor light emitting element 10 may be used.

In this specific example as illustrated in FIG. 1, a p-side substrate electrode 107e and an n-side substrate electrode 108e are provided on the mounting member 20. The p-side substrate electrode 107e and the n-side substrate electrode 108e are connected to the p-side electrode 107 and the n-side electrode 108 of the semiconductor light emitting element 10 via a p-side interconnect 107w and an n-side interconnect 108w, respectively. However, the description recited above is one example; and the embodiments of the invention are not limited thereto. Various modifications of the form of the electrical connections and the dispositions of the semiconductor light emitting element 10 and the mounting member 20 are possible.

Although the mounting member 20 is a member having a cup-like configuration on which the semiconductor light emitting element 10 is mounted in this specific example, it is sufficient for the mounting member 20 to be a component on which the semiconductor light emitting element 10 can be mounted. The configuration of the mounting member 20 is arbitrary. The mounting member 20 may include any material such as an inorganic material, an organic material, etc.

The face of the mounting member 20 on the semiconductor light emitting element 10 side (the first wavelength conversion layer 30 side) may be a face having a high reflectance. For example, a reflective film (not illustrated) made of Ag, etc., may be provided on the face of the mounting member 20 on the semiconductor light emitting element 10 side, that is, on the mounting face of the mounting member 20 (the face on which the semiconductor light emitting element 10 is mounted).

The first wavelength conversion layer 30 may include a first wavelength conversion particle 31 dispersed in a first resin 32, where the first wavelength conversion particle 31 absorbs the first light and emits the second light.

The first wavelength conversion particle 31 may include, for example, a fluorescer fine particle, a nitride semiconductor fine particle, etc. The nitride semiconductor may include $Al_xGa_yIn_{1-x-y}N$ ($0 \leq x \leq 1$, $0 \leq y \leq 1$, and $x+y \leq 1$). For such a nitride semiconductor, the wavelength of the emitted light can be changed by changing the values of x and y recited above. In the nitride semiconductor recited above, a portion of the Group III elements may be replaced with B, Tl, etc. A portion of N may be replaced with P, As, Sb, Bi, etc.

The first wavelength conversion particle 31 is not limited to one type of material and may include two or more types of materials.

For example, a silicone-based resin, etc., may be used as the first resin 32 of the first wavelength conversion layer 30.

The first wavelength conversion layer 30 may have a bonding function of bonding the semiconductor light emitting element 10 to the mounting member 20. In other words, a material having a bonding function may be used as the first resin 32. Thereby, the semiconductor light emitting element 10 can be fixed to the mounting member 20 without providing a separate bonding agent; a decrease of the luminous efficacy caused by separately providing the bonding agent can be suppressed; and the processes can be simplified.

The second wavelength conversion layer 80 may include a second wavelength conversion particle (not illustrated) dispersed in a second resin (not illustrated), where the second wavelength conversion particle absorbs the first light and emits the third light.

The second wavelength conversion particle is not limited to one type of material and may include two or more types of materials.

The second wavelength conversion particle may include, for example, a fluorescer fine particle, a nitride semiconductor fine particle, etc. For example, a silicone-based resin, etc., may be used as the second resin of the second wavelength conversion layer 80.

The light emission characteristic (e.g., the light emission wavelength) of the third light emitted by the second wavelength conversion layer 80 may be set appropriately based on the light emission characteristic (e.g., the light emission wavelength) of the first light emitted by the semiconductor light emitting element 10 and the light emission characteristic (e.g., the light emission wavelength) of the second light emitted by the first wavelength conversion layer 30.

The wavelength of the third light is not longer than the wavelength of the second light. For example, in the case where the first light is blue light, the second light may be yellow light and the third light also may be yellow light. Also, for example, in the case where the first light is blue light, the second light may be red light and the third light may be green light. In the case where, for example, the first light is near-ultraviolet light, the second light may be yellow light and the third light may be blue and green light.

The first transparent layer 60 may include any material transparent to the first light, the second light, and the third light. In other words, the first transparent layer 60 is substantially transparent to wavelengths near the light emission wavelength of the semiconductor light emitting element 10 and wavelengths in wavelength regions longer thereto. The first transparent layer 60 may include, for example, any organic material and the like such as a silicone-based resin.

A transparent resin layer, for example, may be provided as the first transparent layer 60 with, for example, an exterior surface having a curved configuration protruding upward (along the direction from the mounting member 20 toward the semiconductor light emitting element 10) to cover the semiconductor light emitting element 10. The curve of the cross section of the curved surface having the upward protruding configuration may have any configuration such as, for example, a semicircular arc-like configuration, a parabolic configuration, etc.

In this specific example, the end portion of the first transparent layer 60 contacts the mounting member 20. Thus, by providing the first transparent layer 60 to cover the semiconductor light emitting element 10, the first transparent layer 60 can protect the semiconductor light emitting element 10; and the reliability of the light emitting device 210 increases. However, the embodiments of the invention are not limited thereto. In some cases, at least a portion of the end portion of the first transparent layer 60 may be provided apart from the mounting member 20.

Figure 3:
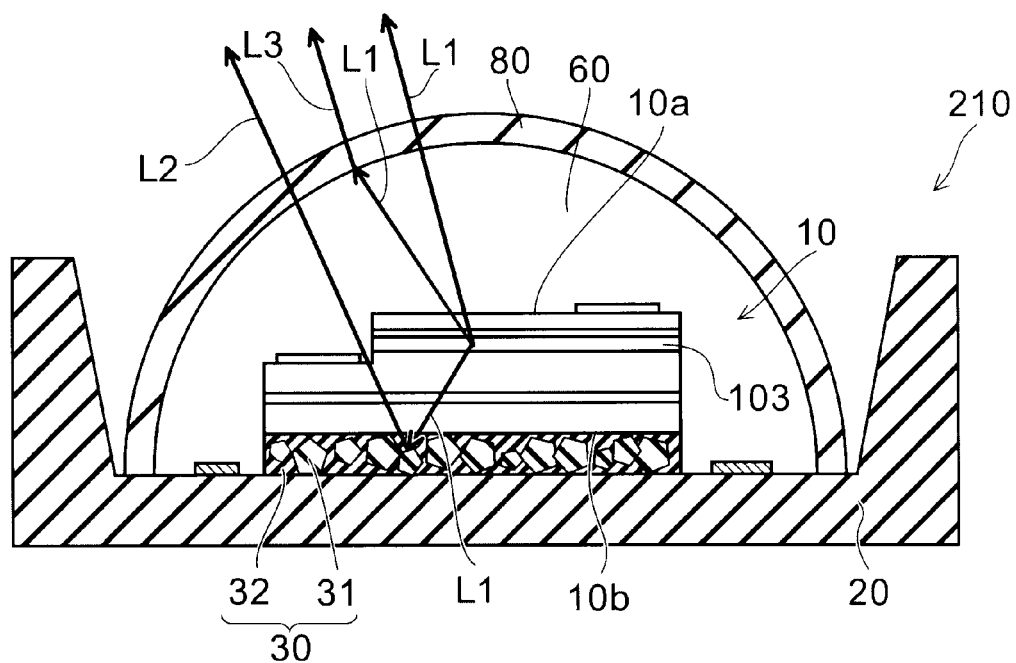
FIG. 3 is a schematic view illustrating operations of the light emitting device.

FIG. 3 is a schematic view illustrating operations of the light emitting device according to the first embodiment of the invention.

As illustrated in FIG. 3, a portion of a first light L1 emitted by the light emitting layer 103 of the semiconductor light emitting element 10 travels toward the first major surface 10*a* (the upper face) on the p-type semiconductor layer side, passes through the first transparent layer 60 and the second wavelength conversion layer 80, and is extracted to the outside of the light emitting device 210.

When the first light L1 traveling toward the first major surface 10*a* passes through the first transparent layer 60 and enters the second wavelength conversion layer 80, a portion of the first light L1 is absorbed in the second wavelength conversion layer 80; a third light L3 having a wavelength characteristic of a wavelength longer than that of the first light L1 is emitted; and the third light L3 is emitted to the outside of the light emitting device 210.

At this time, although heat is generated in the second wavelength conversion layer 80 when the third light L3 is emitted by the second wavelength conversion layer 80, the first transparent layer 60 is provided to cover the semiconductor light emitting element 10; and the second wavelength conversion layer 80 is provided thereon. Therefore, even in the case where heat is generated by the second wavelength conversion layer 80, the heat conduction between the second wavelength conversion layer 80 and the semiconductor light emitting element 10 can be suppressed; the increase of the temperature of the semiconductor light emitting element 10 can be suppressed; and a high value of the luminous efficacy of the semiconductor light emitting element 10 can be maintained.

One other portion of the first light L1 travels toward the second major surface 10*b* (the lower face) on the n-type semiconductor layer (the n-type contact layer 102) side and enters the first wavelength conversion layer 30. The first light L1 is absorbed in the first wavelength conversion layer 30; and a second light L2 having a wavelength characteristic of a wavelength longer than that of the first light L1 is emitted.

In the case where the first wavelength conversion layer 30 is not provided, the efficiency decreases because the first light L1 emitted from the semiconductor light emitting element to the mounting member 20 side is reflected by the mounting member 20, returns to the interior of the semiconductor light emitting element 10, and is undesirably reabsorbed particularly by the light emitting layer 103 of the semiconductor light emitting element 10.

Conversely, by providing the first wavelength conversion layer 30, the first light L1 emitted from the semiconductor light emitting element 10 to the mounting member 20 side is converted into the second light L2 having a wavelength longer than that of the first light L1. Thereby, the second light L2 is not easily reabsorbed by the semiconductor light emitting element 10 (particularly the light emitting layer 103) because the wavelength of the second light L2 is longer than that of the first light L1 even in the case where the second light L2 is reflected by the mounting member 20, returns to the interior of the semiconductor light emitting element 10, and enters the semiconductor light emitting element 10 (particularly the light emitting layer 103). Therefore, the second light L2 is easily emitted from the semiconductor light emitting element 10 to the outside; and losses are low.

Heat is also generated in the first wavelength conversion layer 30 when the second light L2 is emitted by the first wavelength conversion layer 30. At this time, the first wavelength conversion layer 30 contacts the mounting member 20. Therefore, the heat of the first wavelength conversion layer 30 is conducted efficiently to the mounting member 20 and is dissipated. Therefore, the increase of the temperature of the semiconductor light emitting element 10 due to the heat of the first wavelength conversion layer 30 can be suppressed; and a high value of the luminous efficacy of the semiconductor light emitting element 10 can be maintained.

In the light emitting device 210, the first wavelength conversion layer 30 is provided on the second major surface 10*b* side of the semiconductor light emitting element 10; and the second wavelength conversion layer 80 is provided on the first major surface 10*a* side. Thereby, the first wavelength conversion layer 30 is distal to the second wavelength conversion layer 80. Therefore, for example, the third light L3 emitted by the second wavelength conversion layer 80 is suppressed from entering the first wavelength conversion layer 30 and being reabsorbed. Thereby, the luminous efficacy also increases.

Thus, according to the light emitting device 210, a light emitting device having a high luminous efficacy can be provided.

Providing the third light L3 with a wavelength not longer than the wavelength of the second light L2 increases the luminous efficacy. In other words, in the case where the wavelength of the second light L2 is shorter than the wavelength of the third light L3, the second light L2 is absorbed by the second wavelength conversion layer 80 when the second light L2 passes through the second wavelength conversion layer 80; and the efficiency may decrease. However, by providing the third light L3 with a wavelength not longer than the wavelength of the second light L2, the absorption of the second light L2 in the second wavelength conversion layer 80 is suppressed; and the efficiency increases.

First Comparative Example

Figure 4:
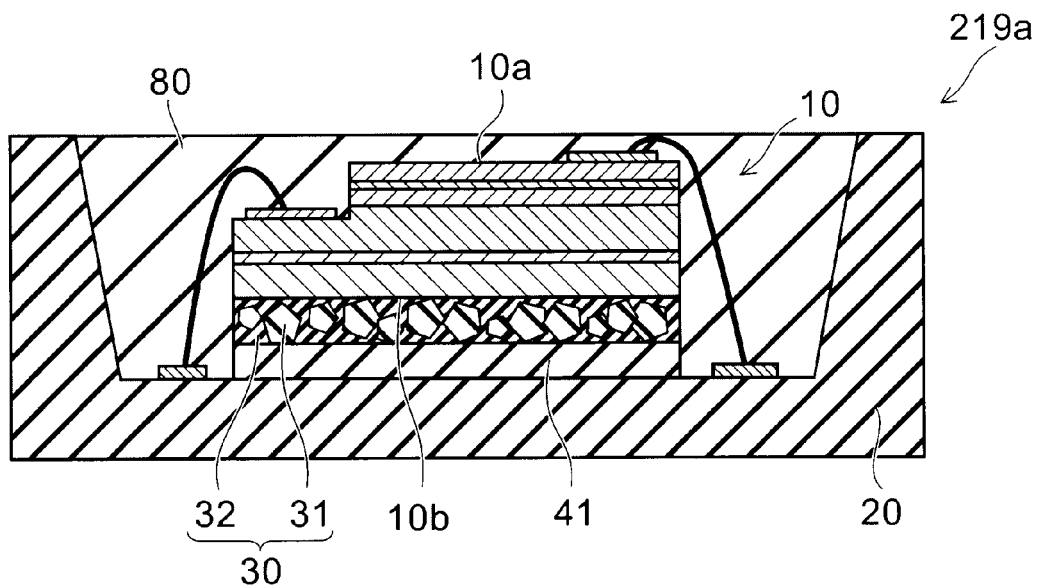
FIG. 4 is a schematic cross-sectional view illustrating a light emitting device of a comparative example.

FIG. 4 is a schematic cross-sectional view illustrating the configuration of the light emitting device of a first comparative example.

In the light emitting device 219a of the first comparative example as illustrated in FIG. 4, the first transparent layer 60 is not provided; and the second wavelength conversion layer 80 is provided directly on the semiconductor light emitting element 10. A silicone-based transparent die bonding material layer 41 (a die bonding adhesive) is provided on the mounting member 20; the first wavelength conversion layer 30 is provided thereon; and the semiconductor light emitting element 10 is further provided thereon. This configuration corresponds to the configuration discussed in JP-A 2001-210874 (Kokai).

In the light emitting device 219a of the first comparative example, the temperature of the semiconductor light emitting element 10 increases due to the heat generated by the second wavelength conversion layer 80 because the second wavelength conversion layer 80 is provided directly on the semiconductor light emitting element 10. Further, because the silicone-based transparent die bonding material layer 41 is provided between the first wavelength conversion layer 30 and the mounting member 20, the heat generated by the second wavelength conversion layer 80 is not easily conducted to the mounting member 20 and is not easily dissipated; and this also causes the temperature of the semiconductor light emitting element 10 to increase. Thus, in the light emitting device 219a of the first comparative example, the temperature of the semiconductor light emitting element 10 increases; and the luminous efficacy decreases.

Second Comparative Example

Figure 5:
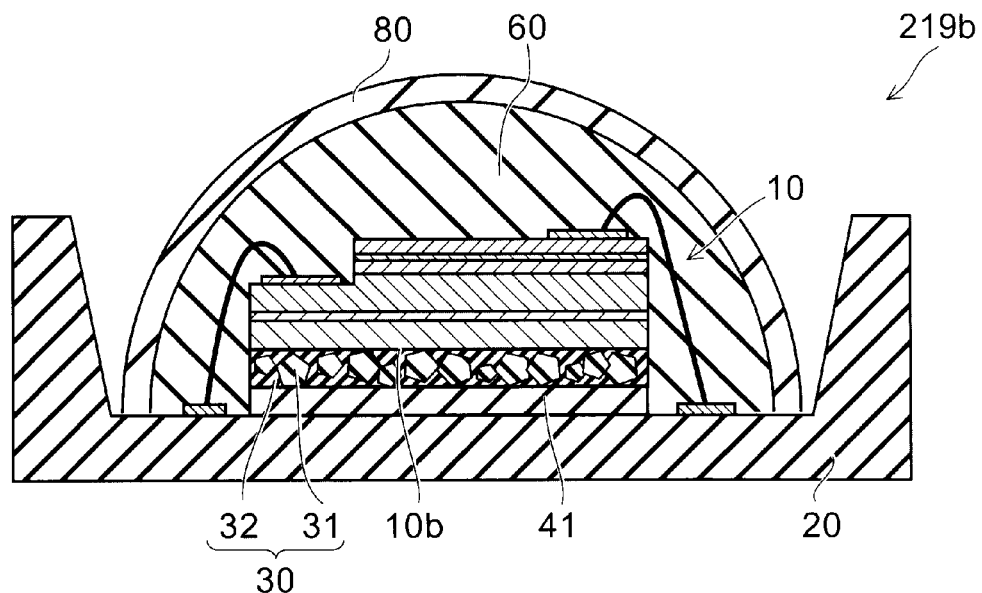
FIG. 5 is a schematic cross-sectional view illustrating a light emitting device of a comparative example.

FIG. 5 is a schematic cross-sectional view illustrating the configuration of a light emitting device of a second comparative example.

In the light emitting device 219b of the second comparative example as illustrated in FIG. 5, the silicone-based transparent die bonding material layer 41 is provided between the mounting member 20 and the first wavelength conversion layer 30 of the light emitting device 210 according to this embodiment.

Although the first transparent layer 60 is provided on the semiconductor light emitting element 10 of the light emitting device 219b of the second comparative example to reduce the effects of the heat generated by the second wavelength conversion layer 80, the silicone-based transparent die bonding material layer 41 is provided between the first wavelength conversion layer 30 and the mounting member 20. Therefore, the heat generated by the second wavelength conversion layer 80 is not easily dissipated via the mounting member 20; and, as expected, the temperature of the semiconductor light emitting element 10 increases. Therefore, in the light emitting device 219b of the second comparative example as well, the temperature of the semiconductor light emitting element 10 increases; and the luminous efficacy decreases.

Third Comparative Example

Figure 6:
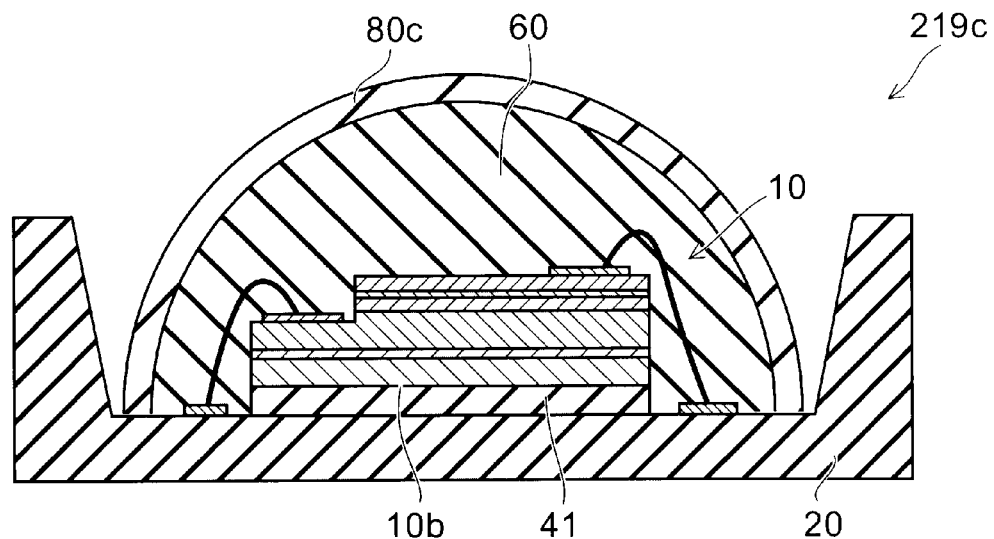
FIG. 6 is a schematic cross-sectional view illustrating a light emitting device of a comparative example.

FIG. 6 is a schematic cross-sectional view illustrating the configuration of a light emitting device of a third comparative example.

As illustrated in FIG. 6, the first wavelength conversion layer 30 is not provided in the light emitting device 219c of the third comparative example. The semiconductor light emitting element 10 is bonded to the mounting member 20 by the silicone-based transparent die bonding material layer 41. A second wavelength conversion layer 80c is provided on the first transparent layer 60.

In the light emitting device 219c of the third comparative example, the first transparent layer 60 is provided on the semiconductor light emitting element 10. Therefore, the effects of the heat generated by the second wavelength conversion layer 80c decrease. However, because the first wavelength conversion layer 30 is not provided, the first light L1 emitted from the semiconductor light emitting element 10 to the mounting member 20 side is reflected by the mounting member 20, returns to the interior of the semiconductor light emitting element 10, and is reabsorbed particularly by the light emitting layer 103 of the semiconductor light emitting element 10; and the efficiency decreases.

Fourth Comparative Example

Figure 7:
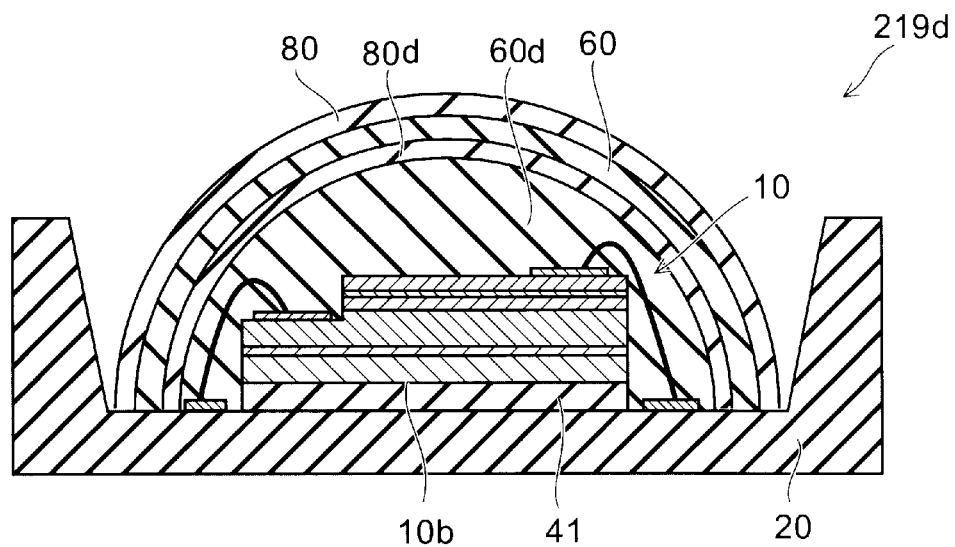
FIG. 7 is a schematic cross-sectional view illustrating a light emitting device of a comparative example.

FIG. 7 is a schematic cross-sectional view illustrating the configuration of a light emitting device of a fourth comparative example.

In the light emitting device 219d of the fourth comparative example as illustrated in FIG. 7, the first wavelength conversion layer 30 is not provided while the silicone-based transparent die bonding material layer 41 is provided between the semiconductor light emitting element 10 and the mounting member 20. The first transparent layer 60 and the second wavelength conversion layer 80 also are provided. An inner wavelength conversion layer 80d is provided on the inner side of the first transparent layer 60; and an inner transparent layer 60d is provided between the inner wavelength conversion layer 80d and the semiconductor light emitting element 10.

In the light emitting device 219d having such a configuration, the inner wavelength conversion layer 80d is disposed proximally to the second wavelength conversion layer 80. Therefore, the third light L3 emitted by the second wavelength conversion layer 80 is easily absorbed by the inner wavelength conversion layer 80d. Although light is emitted efficiently in the inner wavelength conversion layer 80d because the inner wavelength conversion layer 80d is directly excited by the first light L1 from the semiconductor light emitting element 10, the second wavelength conversion layer 80 on the outer side may be excited directly by the first light L1 from the semiconductor light emitting element 10 and may be excited by the first light L1 reflected or scattered by the inner wavelength conversion layer 80d. Therefore, the efficiency of the light emission of the second wavelength conversion layer 80 decreases by the amount of the loss occurring due to the reflection or the scattering by the inner wavelength conversion layer 80d. Therefore, the luminous efficacy decreases.

Moreover, in the case of the light emitting device 219d, the first wavelength conversion layer 30 is not provided. Therefore, the first light L1 emitted from the semiconductor light emitting element 10 toward the mounting member 20 is reflected by the mounting member 20, again enters the semiconductor light emitting element 10, and is lost due to the reabsorption particularly by the light emitting layer 103 of the semiconductor light emitting element 10; and the luminous efficacy decreases.

Conversely, the light emitting device 210 can suppress the decrease of the efficiency due to the light being reflected by the mounting member 20 to return to the interior of the semiconductor light emitting element 10 and be reabsorbed by the light emitting layer 103 of the semiconductor light emitting element 10 because the first wavelength conversion layer 30 converts the first light L1 into the second light L2 having a wavelength longer than that of the first light L1. Also, the heat dissipation is good because the first wavelength conversion layer 30 contacts the mounting member 20; and the decrease of the efficiency due to heat can be suppressed.

Further, by providing the first transparent layer 60 between the second wavelength conversion layer 80 and the semiconductor light emitting element 10, the temperature increase of the semiconductor light emitting element 10 due to the heat generation during the wavelength conversion of the second wavelength conversion layer 80 can be suppressed; and the decrease of the luminous efficacy due to the temperature increase of the semiconductor light emitting element 10 can be suppressed. The first wavelength conversion layer 30 and the second wavelength conversion layer 80 are distal to each other by disposing the first wavelength conversion layer 30 on the lower side of the semiconductor light emitting element 10 and disposing the second wavelength conversion layer 80 on the upper side. Therefore, for example, the third light L3 emitted by the second wavelength conversion layer 80 can be suppressed from entering the first wavelength conversion layer 30 and being reabsorbed. Thereby, the luminous efficacy increases.

Also, by providing the first transparent layer 60 between the second wavelength conversion layer 80 and the semiconductor light emitting element 10, the film thickness of the second wavelength conversion layer 80 can be easily adjusted; and the reabsorption of the second light L2 in the second wavelength conversion layer 80 can be suppressed by optimally adjusting the film thickness. Thereby, a light emitting device having a high luminous efficacy can be obtained.

The end portion of the second wavelength conversion layer 80 can be provided, for example, to contact the mounting member 20. Thereby, the heat generated by the second wavelength conversion layer 80 can be conducted efficiently to the mounting member 20; the temperature increase of the semiconductor light emitting element 10 can be decreased further; the luminous efficacy of the semiconductor light emitting element 10 can be increased; and the efficiency of the light emitting device 210 can be increased further.

However, the embodiments of the invention are not limited thereto. At least a portion of the end portion of the second wavelength conversion layer 80 may be provided apart from the mounting member 20 in the case where little heat is generated by the second wavelength conversion layer 80, in the case where the temperature of the semiconductor light emitting element 10 does not increase easily, in the case where the luminous efficacy does not decrease easily even when the temperature of the semiconductor light emitting element 10 increases, etc.

The first transparent layer 60 may include a layer including a gas (including air). Thereby, the heat generated by the second wavelength conversion layer 80 is not easily conducted to the semiconductor light emitting element 10; and the efficiency increases. In the case where the first transparent layer 60 is a gas (including air) layer, for example, the second wavelength conversion layer 80 may be formed using a die and the like such that the second wavelength conversion layer 80 maintains its own shape; and the formed second wavelength conversion layer 80 can be disposed on the semiconductor light emitting element 10 to cover the semiconductor light emitting element 10.

By multiply providing wavelength conversion layers such as the first wavelength conversion layer 30 and the second wavelength conversion layer 80, it is easier to control the wavelength characteristic of the light emitted by the light emitting device 210; and it is easier to realize the desired light emission with a high color rendition.

As described above, in the light emitting device 210 according to this embodiment, it is desirable for the wavelength band of the third light L3 to be not longer than the wavelength band of the second light L2. For example, the shortest wavelength of the wavelength band of the third light L3 is not longer than the shortest wavelength of the wavelength band of the second light L2. For example, the longest wavelength of the wavelength band of the third light L3 is not longer than the longest wavelength of the wavelength band of the second light L2. For example, the longest wavelength of the wavelength band of the third light L3 may be equal to or shorter than the shortest wavelength of the wavelength band of the second light L2.

For example, in the case where the first light L1 emitted from the semiconductor light emitting element 10 is light having a light emission peak in the blue region, the first wavelength conversion layer 30 emits a yellow second light L2 (e.g., a fluorescence); and the second wavelength conversion layer 80 also emits a yellow third light L3. Thereby, the light emitting device 210 can emit a white light.

Also, in the case where the first light L1 emitted from the semiconductor light emitting element 10 is light having a light emission peak in the blue region, the first wavelength conversion layer 30 emits a red second light L2 (e.g., a fluorescence); and the second wavelength conversion layer 80 emits a green third light L3. Thereby, the light emitting device 210 emits light of the three colors of red, green, and blue and can emit white light.

In the case where the first light L1 emitted from the semiconductor light emitting element 10 is light having a light emission peak in the near-ultraviolet region, the first wavelength conversion layer 30 may emit a red second light L2 (e.g., a fluorescence); and the second wavelength conversion layer 80 may emit a green and blue third light L3. Thereby, the light emitting device 210 emits light of the three colors of red, green, and blue and can emit white light.

Thus, for example, a yellow fluorescer may be used as the first wavelength conversion particle 31 of the first wavelength conversion layer 30; and a yellow fluorescer also may be used in the second wavelength conversion layer 80. Further, for example, a red fluorescer may be used as the first wavelength conversion particle 31 of the first wavelength conversion layer 30; and a green fluorescer may be used as the second wavelength conversion particle of the second wavelength conversion layer 80. Also, a red fluorescer may be used as the first wavelength conversion particle 31 of the first wavelength conversion layer 30; and the two types of a blue fluorescer and a green fluorescer may be used as the second wavelength conversion particles of the second wavelength conversion layer 80.

However, the description recited above is an example of a configuration in the case where the light emitting device 210 emits white light. The combination of the light emission characteristics of the first light L1, the second light L2, and the third light L3 is arbitrary. The light emission characteristics of the first light L1, the second light L2, and the third light L3 may be appropriately set based on the specifications of the light to be emitted by the light emitting device.

For example, in this embodiment, any of a red fluorescer layer, a yellow fluorescer layer, a green fluorescer layer, and a blue fluorescer layer may be used in the first wavelength conversion layer 30 and the second wavelength conversion layer 80.

The red fluorescer layer may emit light in a wavelength region of, for example, 600 nm to 780 nm. The yellow fluorescer layer may emit light in a wavelength region of, for example, 550 nm to 590 nm. The green fluorescer layer may emit light in a wavelength region of, for example, 475 nm to 520 nm. The blue fluorescer layer may emit light in a wavelength region, for example, of 430 nm to 475 nm.

The red fluorescer layer may contain, for example, a nitride-based fluorescer of $CaAlSiN_3$:Eu or a sialon-based fluorescer. In particular, in the case where a sialon-based fluorescer is used, it is favorable to use

$(M_{1-x},R_x)_{a1}AlSi_{b1}O_{c1}N_{d1}$      Compositional Formula (1)

where M is at least one type of metal element excluding Si and Al, and it is particularly desirable for M to be at least one selected from Ca and Sr; R is a light emission center element, and it is particularly desirable for R to be Eu; and x, a1, b1, c1, and d1 satisfy the relationships $0<x\leq 1$, $0.6<a1<0.95$, $2<b1<3.9$, $0.25<c1<0.45$, and $4<d1<5.7$.

By using the sialon-based fluorescer of Compositional Formula (1), the temperature characteristics of the wavelength conversion efficiency can be improved; and the efficiency in the high current density region can be increased further.

The yellow fluorescer layer may contain, for example, a silicate-based fluorescer of $(Sr, Ca, Ba)_2SiO_4$:Eu.

The green fluorescer layer may contain, for example, a halophosphate-based fluorescer of $(Ba, Ca, Mg)_{10}(PO_4)_6.Cl_2$:Eu or a sialon-based fluorescer. In particular, in the case where a sialon-based fluorescer is used, it is favorable to use

$(M_{1-x},R_x)_{a2}AlSi_{b2}O_{c2}N_{d2}$      Compositional Formula (2)

where M is at least one type of metal element excluding Si and Al, and it is particularly desirable for M to be at least one selected from Ca and Sr; R is a light emission center element, and it is particularly desirable for R to be Eu; and x, a2, b2, c2, and d2 satisfy the relationships $0<x\leq 1$, $0.93<a2<1.3$, $4.0<b2<5.8$, $0.6<c2<1$, and $6<d2<11$. By using the sialon-based fluorescer of Compositional Formula (2), the temperature characteristics of the wavelength conversion efficiency can be improved; and the efficiency in the high current density region can be increased further.

The blue fluorescer layer may contain, for example, an oxide-based fluorescer of $BaMgAl_{10}O_{17}$:Eu.

Any resin regardless of the type may be used as the resins (the first resin 32 and the second resin) used in the first wavelength conversion layer 30 and the second wavelength conversion layer 80 as long as the resin is substantially transparent to the wavelengths near the light emission wavelength of the first light L1 emitted by the semiconductor light emitting element 10 and wavelengths in wavelength regions longer thereto. Such resins include, for example, silicone resin, epoxy resin, polydimethylsiloxane derivative having an epoxy group, oxetane resin, acrylic resin, cycloolefin resin, urea resin, fluorocarbon resin, polyimide resin, etc.

The second wavelength conversion layer 80 may have a configuration in which multiple fluorescer layers having different light emission wavelengths are stacked. In such a case, it is favorable for the multiple fluorescer layers to be stacked such that the fluorescer layers having longer wavelengths are disposed more toward the semiconductor light emitting element 10 side than the fluorescer layers having shorter wavelengths.

It is favorable to further provide one other transparent layer on the outer side (the side opposite to the semiconductor light emitting element 10) of the second wavelength conversion layer 80. By providing the one other transparent layer, the proportion of the light extracted to the outside increases; and the efficiency increases further. In other words, the reflection and the scattering that occur at the interface between the second wavelength conversion layer 80 and an external medium (e.g., air) due to recesses and protrusions of the fluorescer particles are suppressed; the reabsorption by the second wavelength conversion layer 80 decreases; the proportion of the light extracted to the outside increases; and the efficiency increases. Also, the reliability can be increased by providing the one other transparent layer.

The one other transparent layer may be formed from multiple layers having different refractive indexes. In such a case, it is favorable to stack the layers such that the refractive indexes thereof decrease from the second wavelength conversion layer 80 side toward the outside. Thus, the reflection and the scattering at the interface between the second wavelength conversion layer 80 and the external medium (e.g., air) is suppressed; and the efficiency increases.

It is desirable for the particle size of the first wavelength conversion particle 31 to be not less than 1 micrometer (μm) and not more than 50 μm. In the case where the particle size of the first wavelength conversion particle 31 is not less than 1 μm and not more than 50 μm, the wavelength conversion efficiency of the first wavelength conversion layer 30 increases; and the luminous efficacy increases. In the case where the particle size of the first wavelength conversion particle 31 is less than 1 μm, the absorbency index of the first light L1 in the first wavelength conversion layer 30 decreases; and the luminous efficacy easily decreases. In the case where the particle size of the first wavelength conversion particle 31 is greater than 50 μm, the heat dissipation is poor; and the luminous efficacy may decrease. In some cases, the bonding strength of the first wavelength conversion layer 30 may decrease; and the reliability of the light emitting device may deteriorate.

At least one selected from the first wavelength conversion layer 30 and the second wavelength conversion layer 80 may include multiple layers. For example, the second wavelength conversion layer 80 may include, for example, a green fluorescer layer including a green fluorescer and a blue fluorescer layer including a blue fluorescer stacked on the green fluorescer layer. The second wavelength conversion layer 80 may further include another transparent layer provided between the green fluorescer layer recited above and the blue fluorescer layer recited above. Thereby, both the optical characteristics and the ease of manufacturing can be improved further.

FIRST EXAMPLE

Characteristics of a light emitting device of a first example according to this embodiment will now be described compared to a comparative example. The light emitting device 210a of the first example is an example in which the first light L1 emitted from the semiconductor light emitting element 10 is blue light and the light emitted from the first wavelength conversion layer 30 and the second wavelength conversion layer 80 (the second light L2 and the third light L3) both are yellow light.

The light emitting device 210a of the first example has a configuration similar to the configuration of the light emitting device 210 illustrated in FIG. 1. The light emitting device 210a was constructed as follows.

A mounting substrate made of AlN was used as the mounting member 20. In other words, the mounting member 20 was constructed by molding an AlN material.

On the other hand, a blue LED chip having a light emitting layer 103 including an InGaN compound semiconductor was used as the semiconductor light emitting element 10. The peak of the light emission wavelength (the wavelength of the first light L1) of the semiconductor light emitting element 10 was 450 nm (nanometers).

The first wavelength conversion layer 30 was formed on the mounting face of the mounting member 20. A silicate-based yellow fluorescer (having a composition of $(Sr, Ca, Ba)_2SiO_4:Eu$) having a light emission peak at 560 nm was used as the first wavelength conversion particle 31 of the first wavelength conversion layer 30. A silicone-based transparent die bonding material was used as the first resin 32. The first wavelength conversion particle 31 having a particle size of about 10 μm was dispersed in the first resin 32 with a concentration of 50 wt % (weight percent) and then coated onto the mounting face of the mounting member 20 to form the first wavelength conversion layer 30.

The semiconductor light emitting element 10 was bonded to the mounting member 20 and fixed by placing the semiconductor light emitting element 10 on the first wavelength conversion layer 30 and drying the first wavelength conversion layer 30. Subsequently, the p-side substrate electrode 107e and the n-side substrate electrode 108e of the mounting member 20 were electrically connected to the p-side electrode 107 and the n-side electrode 108 of the semiconductor light emitting element 10 by the p-side interconnect 107w and the n-side interconnect 108w, respectively.

Then, a silicone resin layer forming the first transparent layer 60 was formed on the semiconductor light emitting element 10. In other words, a dispenser was used to coat silicone resin to cover the semiconductor light emitting element 10 while heating the mounting member 20 to a temperature of 150° C. in ambient air at atmospheric pressure. The ratio of the thickness of the silicone resin at the apical portion to the thickness at the end face was substantially 1:1; and the silicone resin was coated in a curved configuration protruding upward. Then, the silicone resin was dried at 150° C. for 60 minutes at atmospheric pressure; and the first transparent layer 60 was formed.

On the other hand, a yellow fluorescer dispersion resin forming the second wavelength conversion layer 80 was prepared by dispersing a silicate-based yellow fluorescer (having a composition of $(Sr, Ca, Ba)_2SiO_4:Eu$) in a silicone-based transparent resin. The yellow fluorescer dispersion resin was coated using a dispenser to cover the entire first transparent layer 60 while heating the mounting member 20 to 150° C. at atmospheric pressure in ambient air. The film thickness of the yellow fluorescer dispersion resin was substantially uniform; and the configuration of the yellow fluorescer dispersion resin had a curved configuration protruding upward to conform to the configuration of the first transparent layer 60. Subsequently, the yellow fluorescer dispersion resin was dried at 150° C. for 60 minutes at atmospheric pressure; and the second wavelength conversion layer 80 was formed. The ratio of the thickness of the second wavelength conversion layer 80 at the apical portion to the thickness at the end face was substantially 1:1.

Thus, the light emitting device 210a of the first example was constructed.

The light emission characteristic of the light emitting device 210a was measured. The luminous efficacy was 84.9 (lm/W) when driven by a current of 20 mA; and a high efficiency was obtained.

On the other hand, the light emitting device 219b of the second comparative example illustrated in FIG. 5 was constructed. In other words, the silicone-based transparent die bonding material layer 41 was provided on the mounting face of the mounting member 20; the first wavelength conversion layer 30 was formed thereon; and the semiconductor light emitting element 10 was placed thereon. The luminous efficacy of the light emitting device 219b having such a configuration was 83.8 (lm/W) when driven by a current of 20 mA; and the efficiency was lower than that of the light emitting device 210a of the first example.

The light emitting device 219c of the third comparative example illustrated in FIG. 6 was constructed. In other words, the silicone-based transparent die bonding material layer 41 was provided on the mounting face of the mounting member 20; the semiconductor light emitting element 10 was placed thereon; and after performing the electrical connections, the first transparent layer 60 and the second wavelength conversion layer 80c were formed. At this time, the specifications of the second wavelength conversion layer 80c of the light emitting device 219c were adjusted such that the light emission color of the light emitting device 219c matched the light emission color of the light emitting device 210a of the first example. In other words, the thickness of the second wavelength conversion layer 80c of the light emitting device 219c was thicker than the thickness of the second wavelength conversion layer 80 of the light emitting device 210a of the first example. The luminous efficacy of the light emitting device 219c having such a configuration was 80.7 (lm/W) when driven by a current of 20 mA; and the efficiency was lower than that of the second comparative example.

Thus, according to this embodiment, a light emitting device having a high luminous efficacy can be provided.

The chromaticity coordinates of the light emission color of the light emitting device 210a of the first example, the light emitting device 219b of the second comparative example, and the light emitting device 219c of the third comparative example were (0.34, 0.35). The light emission color of each of these light emitting devices was white light. According to the light emitting device 219a of the first example, a light emitting device emitting white light and having a high efficiency was provided.

Because the first transparent layer 60 is not provided in the light emitting device 219a of the first comparative example illustrated in FIG. 4, the heat generated by the second wavelength conversion layer 80 causes the temperature of the semiconductor light emitting element 10 to increase; and the luminous efficacy of the semiconductor light emitting element 10 decreases. Further, it is difficult to adjust the film thickness of the second wavelength conversion layer 80; the reabsorption in the second wavelength conversion layer 80 increases; the luminous efficacy decreases; and fluctuation of the luminance and uneven color occur. Accordingly, it is considered that such a configuration has an even lower efficiency than the second comparative example.

Second Embodiment

Figure 8:
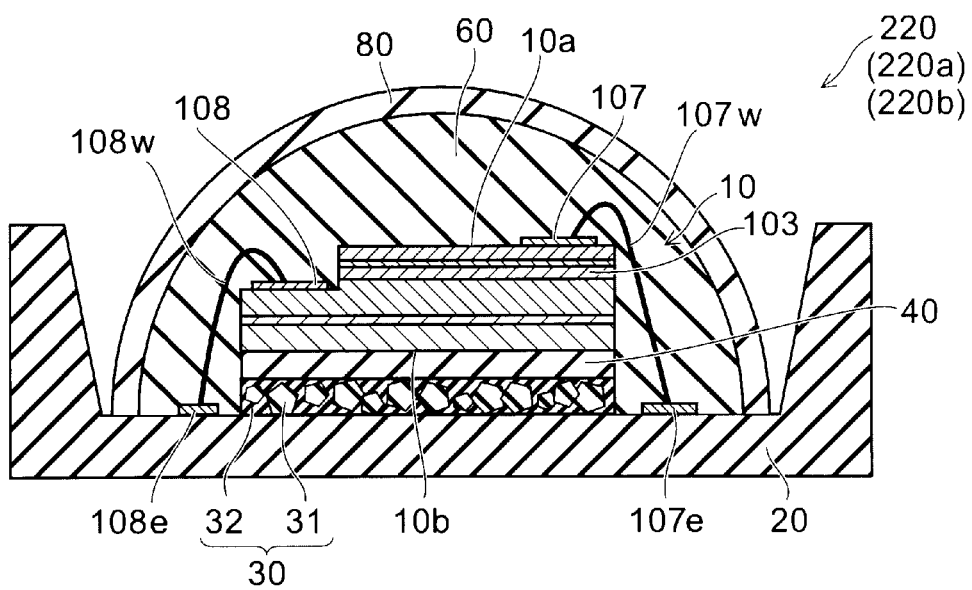
FIG. 8 is a schematic cross-sectional view illustrating a light emitting device.

FIG. 8 is a schematic cross-sectional view illustrating the configuration of a light emitting device according to a second embodiment of the invention.

As illustrated in FIG. 8, the light emitting device 220 according to the second embodiment further includes a second transparent layer 40. The second transparent layer 40 is provided between the semiconductor light emitting element 10 and the first wavelength conversion layer 30 in contact with the semiconductor light emitting element 10 and the first wavelength conversion layer 30. The second transparent layer 40 is transparent to the first light L1 and the second light L2.

The second transparent layer 40 may include any material transparent to the first and second light. In other words, the second transparent layer 40 is substantially transparent to wavelengths near the light emission wavelength of the semiconductor light emitting element 10 and wavelengths in wavelength regions longer thereto. The second transparent layer 40 may include, for example, any organic material such as a silicone-based resin and any inorganic material including oxides such as $SiO_2$, nitrides such as SiN, and oxynitrides such as SiON.

By providing the second transparent layer 40 in the light emitting device 220 according to this embodiment, the light reflected by the mounting member 20 is emitted directly to the outside without returning to the semiconductor light emitting element 10; and the light extraction efficiency increases further.

Figure 9:
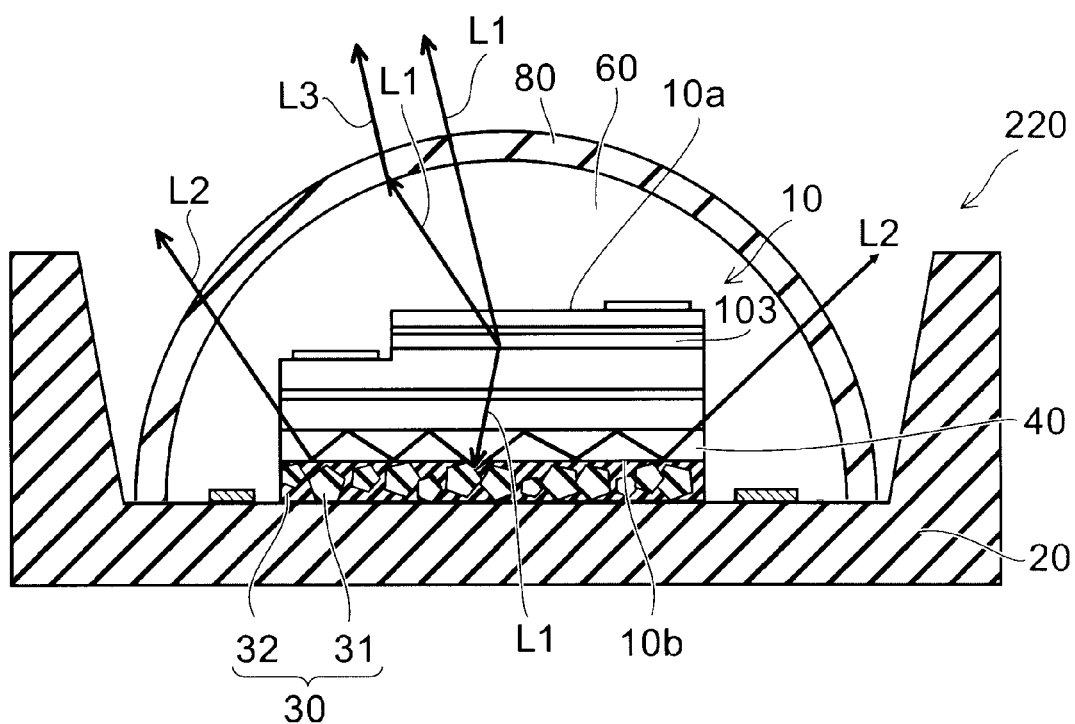
FIG. 9 is a schematic view illustrating operations of the light emitting device.

FIG. 9 is a schematic view illustrating operations of the light emitting device according to the second embodiment of the invention.

As illustrated in FIG. 9, the second light L2 emitted by the first wavelength conversion layer 30 enters the second transparent layer 40 prior to being incident on the semiconductor light emitting element 10. Then, the second light L2 propagates through the second transparent layer 40 and is extracted from the side face of the second transparent layer 40 to the external environment.

For example, the second light L2 propagates through the second transparent layer 40 by being reflected by the interface between the second transparent layer 40 and the second major surface 10b on the second transparent layer 40 side of the semiconductor light emitting element 10 and the interface between the second transparent layer 40 and the first wavelength conversion layer 30 or by being reflected by the interface between the second transparent layer 40 and the second major surface 10b and the interface between the first wavelength conversion layer 30 and the mounting member 20.

Thereby, the second light L2 substantially does not enter the interior (particularly the light emitting layer 103) of the semiconductor light emitting element 10; and the loss due to the second light L2 being absorbed in the interior (particularly the light emitting layer 103) of the semiconductor light emitting element 10 is suppressed. Thereby, the efficiency increases further.

The first light L1 emitted from the semiconductor light emitting element 10 also may propagate through the second transparent layer 40 to be extracted from the side face of the second transparent layer 40 to the external environment.

For example, the first light L1 propagates through the second transparent layer 40 by being reflected by the interface between the second transparent layer 40 and the second major surface 10b on the second transparent layer 40 side of the semiconductor light emitting element 10 and the interface between the second transparent layer 40 and the first wavelength conversion layer 30 or by being reflected by the interface between the second transparent layer 40 and the second major surface 10b and the interface between the first wavelength conversion layer 30 and the mounting member 20.

Thereby, the first light L1 substantially does not enter the interior (particularly the light emitting layer 103) of the semiconductor light emitting element 10 from the mounting member 20 side; and the loss due to the first light L1 being absorbed in the interior (particularly the light emitting layer 103) of the semiconductor light emitting element 10 is suppressed. Thereby, the efficiency increases.

To promote the first light L1 and the second light L2 propagating through the interior of the second transparent layer 40, it is desirable to appropriately set the refractive indexes of the second transparent layer 40, the first wavelength conversion layer 30, and the semiconductor light emitting element 10 (particularly the portion on the second transparent layer 40 side).

In other words, it is desirable for the refractive index (a first refractive index n1) of the portion of the semiconductor light emitting element 10 contacting the second transparent layer 40 (i.e., the portion on the second major surface 10b side, and in this specific example, the substrate 90) to be higher than the refractive index (a second refractive index n2) of the second transparent layer 40. It is desirable for the refractive index (a third refractive index n3) of the portion of the first wavelength conversion layer 30 contacting the second transparent layer 40 to be not higher than the refractive index (the second refractive index n2) of the second transparent layer 40. In other words, it is desirable that $n3 \leq n2 < n1$.

By setting the first refractive index n1 higher than the second refractive index n2, the second light L2 traveling from the second transparent layer 40 toward the semiconductor light emitting element 10 can be reflected efficiently to the second transparent layer 40 side. Further, the first light L1 entering the second transparent layer 40 can be propagated efficiently through the second transparent layer 40.

By setting the third refractive index n3 to be not higher than the second refractive index n2, the second light L2 efficiently enters the second transparent layer 40 from the first wavelength conversion layer 30. Further, the second light L2 from the second transparent layer 40 travelling toward the first wavelength conversion layer 30 can be reflected by the interface between the second transparent layer 40 and the first wavelength conversion layer 30; and the second light L2 can be propagated efficiently through the second transparent layer 40.

In the case where the third refractive index n3 is equal to the second refractive index n2, the first light L1 travelling from the second transparent layer 40 toward the first wavelength conversion layer 30 passes through the interface between the second transparent layer 40 and the first wavelength conversion layer 30 without loss; and the first wavelength conversion layer 30 efficiently emits the second light L2. Also, the second light L2 reflected by the face of the mounting member 20 on the first wavelength conversion layer 30 side can efficiently enter the second transparent layer 40; and the second light L2 can efficiently propagate through the second transparent layer 40. Further, the first light L1 entering the second transparent layer 40 can efficiently propagate through the second transparent layer 40.

For example, in this specific example, sapphire is used as the substrate 90 which is the portion of the semiconductor light emitting element 10 on the side contacting the second transparent layer 40 (the second major surface 10b side). In such a case, the first refractive index n1 is about 1.8. In the case where the portion of the semiconductor light emitting element 10 on the side contacting the second transparent layer 40 (the second major surface 10b side) is the n-type contact layer 102 (e.g., a GaN layer), the first refractive index n1 is about 2.5.

On the other hand, a silicone-based resin, for example, may be used as the second transparent layer 40; and the second refractive index n2 may be about 1.5. The first wavelength conversion layer 30 may include the first wavelength conversion particles 31 dispersed in the first resin 32; a silicone-based resin may be used as the first resin 32; and the third refractive index n3 may be about 1.4. Thus, the relationship $n3 \leq n2 < n1$ can be realized.

By setting the refractive indexes to such a relationship, the first light L1 and the second light L2 are efficiently reflected (e.g., undergo total internal reflections) by the interface on the semiconductor light emitting element 10 side of the second transparent layer 40 and the interface on the first wavelength conversion layer 30 side of the second transparent layer 40. Thereby, the first light L1 and the second light L2 can efficiently propagate through the second transparent layer 40; such light can be emitted to the outside without entering the semiconductor light emitting element 10; the light extraction efficiency can be increased; and the efficiency can be increased.

Thus, the efficiency increases further by controlling the mutual relationship between the first refractive index n1, the second refractive index n2, and the third refractive index n3.

In the case of the light emitting device 220 as well, the first wavelength conversion layer 30 contacts the mounting member 20; and the heat generated by the first wavelength conversion layer 30 is conducted efficiently through the mounting member 20 and dissipated.

Second Example

A light emitting device 220a of a second example according to the second embodiment has a configuration similar to that of the light emitting device 220 illustrated in FIG. 8. The light emitting device 220a of the second example is an example in which the first light L1 emitted from the semiconductor light emitting element 10 is blue light and the light emitted from the first wavelength conversion layer 30 and the second wavelength conversion layer 80 (the second light L2 and the third light L3) both are yellow light. The light emitting device 220a was constructed as follows.

Similarly to the first example, a mounting substrate made of AlN was used as the mounting member 20 and a blue LED chip having a light emitting layer 103 including an InGaN compound semiconductor (having a light emission wavelength peak at 450 nm) was used as the semiconductor light emitting element 10.

First, the second transparent layer 40 was formed on the lower face (the second major surface 10b) of the semiconductor light emitting element 10. A transparent silicone resin was used as the second transparent layer 40. In other words, the second transparent layer 40 was obtained by coating a silicone resin on the lower face (the second major surface 10b) of the semiconductor light emitting element 10 and drying the silicone resin at 150° C. for 10 minutes to 90 minutes at atmospheric pressure. The refractive index (the second refractive index n2) of the silicone resin was 1.54 which was higher than the refractive index (the third refractive index n3) of 1.41 of the first wavelength conversion layer 30 described below and less than the refractive index (the first refractive index n1) of 1.78 of the substrate 90 of the semiconductor light emitting element 10.

On the other hand, similarly to the first example, the first wavelength conversion layer 30 was formed on the mounting face of the mounting member 20. Then, the semiconductor light emitting element 10 having the second transparent layer provided thereon was placed on the first wavelength conversion layer 30; the first wavelength conversion layer 30 was dried; and the semiconductor light emitting element 10 was bonded to the mounting member 20 and fixed by the first wavelength conversion layer 30.

Subsequently, similarly to the first example, the electrical connections were performed; the first transparent layer 60 and the second wavelength conversion layer 80 were formed; and the light emitting device 220a of the second example was constructed.

The light emission characteristics of the light emitting device 220a were measured. The luminous efficacy was 87.7 (lm/W) when driven by a current of 20 mA; and the efficiency was even higher than that of the light emitting device 210a of the first example.

Thus, according to this embodiment, a light emitting device having a high luminous efficacy can be provided.

The chromaticity coordinates of the light emission color of the light emitting device 220a of the second example also were (0.34, 0.35); and the light emission color of the light emitting device 220a was white light.

Third Example

A light emitting device 220b of a third example according to the second embodiment has a configuration similar to that of the light emitting device 220 illustrated in FIG. 8. However, the light emitting device 220b of the third example is an example in which the first light L1 emitted from the semiconductor light emitting element 10 is blue light; the second light L2 emitted from the first wavelength conversion layer 30 is red light; and the third light L3 emitted from the second wavelength conversion layer 80 is green light.

The light emitting device 220b was constructed as follows.

The second transparent layer 40 made of a silicone resin was formed on the lower face (the second major surface 10b) of the semiconductor light emitting element 10 by a method similar to that of the second example.

On the other hand, the first wavelength conversion layer 30 was formed on the mounting face of the mounting member 20. A sialon-based red fluorescer (having a composition of $Sr_2Si_7Al_3ON_{13}:Eu^{2+}$) having a light emission peak at 620 nm was used as the first wavelength conversion particle 31 of the first wavelength conversion layer 30; and a silicone-based transparent die bonding material was used as the first resin 32. The first wavelength conversion layer 30 was formed by dispersing the first wavelength conversion particle 31 in the first resin 32 with a concentration of 50 wt % (weight percent) and coating the first resin 32 on the mounting face of the mounting member 20. Then, the semiconductor light emitting element 10 was bonded to the mounting member 20 and fixed by a method similar to that of the first example; and the p-side substrate electrode 107e and the n-side substrate electrode 108e were electrically connected to the p-side electrode 107 and the n-side electrode 108 of the semiconductor light emitting element 10 by the p-side interconnect 107w and the n-side interconnect 108w, respectively.

Subsequently, after forming the first transparent layer 60 on the semiconductor light emitting element 10 by a method similar to that of the second example, a green second wavelength conversion layer 80 was formed on the first transparent layer 60. In other words, a green fluorescer dispersion resin used to form the second wavelength conversion layer 80 was prepared by dispersing a sialon-based green fluorescer (having a composition of $Sr_3Si_{13}Al_3O_2N_{21}:Eu^{2+}$) having a light emission peak at 520 nm in a silicone-based transparent resin. Then, the green fluorescer dispersion resin was coated to cover the entire first transparent layer 60 by a method similar to that of the second example. The film thickness of the green fluorescer dispersion resin was substantially uniform; and the configuration of the green fluorescer dispersion resin was a curved configuration protruding upward to conform to the configuration of the first transparent layer 60. Subsequently, the second wavelength conversion layer 80 was formed by drying the green fluorescer dispersion resin at 150° C. for 60 minutes at atmospheric pressure. In such a case as well, the ratio of the thickness of the second wavelength conversion layer 80 at the apical portion to the thickness at the end face was substantially 1:1.

Thus, the light emitting device 220b of the third example was constructed.

On the other hand, the light emitting device 219d of a fourth comparative example illustrated in FIG. 7 was constructed as follows. In other words, the electrical connections were performed after mounting the semiconductor light emitting element 10 on the mounting member 20 using the silicone-based transparent die bonding material layer 41; and the inner transparent layer 60d was formed by forming a transparent silicone resin using a method similar to that of the first transparent layer 60. Subsequently, the inner wavelength conversion layer 80d was formed by forming a red fluorescer layer containing a sialon-based red fluorescer (having a composition of $Sr_2Si_7Al_3ON_{13}:Eu^{2+}$) to cover the inner transparent layer 60d using a method similar to that of the second wavelength conversion layer 80. Subsequently, by methods similar to those of the third example, the first transparent layer 60 was formed to cover the inner wavelength conversion layer 80d; and the second wavelength conversion layer 80 was formed by forming a green fluorescer layer containing a sialon-based green fluorescer (having a composition of $Sr_3Si_{13}Al_3O_2N_{21}:Eu^{2+}$) to cover the first transparent layer 60. Thus, the light emitting device 219d was constructed.

In other words, a transparent silicone resin similar to that of the second transparent layer 40 of the light emitting device 220b of the third example was used as the inner transparent layer 60d of the light emitting device 219d of the fourth comparative example. A material similar to that of the first wavelength conversion layer 30 of the light emitting device 220b of the third example was used as the inner wavelength conversion layer 80d of the light emitting device 219d of the fourth comparative example; and the inner wavelength conversion layer 80d was a red fluorescer layer containing a sialon-based red fluorescer (having a composition of $Sr_2Si_7Al_3ON_{13}:Eu^{2+}$).

The same material as the first transparent layer 60 of the light emitting device 220b of the third example was used as the first transparent layer 60 of the light emitting device 219d of the fourth comparative example. A green fluorescer layer containing a sialon-based green fluorescer (having a composition of $Sr_3Si_{13}Al_3O_2N_{21}:Eu^{2+}$) similar to that of the second wavelength conversion layer 80 of the light emitting device 220b of the third example was used as the second wavelength conversion layer 80 of the light emitting device 219d of the fourth comparative example.

The optical characteristics of the light emitting device 220b of the third example and the light emitting device 219d of the fourth comparative example such as those recited above were evaluated.

The chromaticity coordinates of the light emission color of the light emitting device 220b and the light emitting device 219d were (0.34, 0.35); and both of these light emitting devices emitted white light.

The light emitting device 220b of the third example had a luminous efficacy of 69.4 (lm/W) when driven by a current of 20 mA; and a high efficiency was obtained.

On the other hand, the light emitting device 219d of the fourth comparative example had a luminous efficacy of 60.1 (lm/W) when driven by a current of 20 mA; and the efficiency was low.

In the case of the light emitting device 219d of the fourth comparative example, the red fluorescer layer of the inner wavelength conversion layer 80d is disposed proximally to the green fluorescer layer of the second wavelength conversion layer 80. Therefore, the third light L3, which is the green fluorescence emitted by the second wavelength conversion layer 80, is easily absorbed in the inner wavelength conversion layer 80d. Although the inner wavelength conversion layer 80d is excited directly by the first light L1 from the semiconductor light emitting element 10 and can emit light efficiently, the second wavelength conversion layer 80 on the outer side is excited directly by the first light L1 from the semiconductor light emitting element 10 and by the first light L1 reflected or scattered by the inner wavelength conversion layer 80d. Therefore, the efficiency of the light emission of the second wavelength conversion layer 80 decreases by the amount of the loss occurring due to the reflection or the scattering by the inner wavelength conversion layer 80d. Thereby, it is considered that the efficiency decreases. Further, in the case of the light emitting device 219d, the first wavelength conversion layer 30 is not provided. Therefore, the first light L1 emitted from the semiconductor light emitting element 10 toward the mounting member 20 is reflected by the mounting member 20 and again enters the semiconductor light emitting element 10; the loss due to the first light L1 being reabsorbed particularly by the light emitting layer 103 of the semiconductor light emitting element 10 occurs; and the efficiency decreases.

On the other hand, in the light emitting device 220b of the third example in which the second transparent layer 40 is provided, the second light L2 (the red light) emitted by the red first wavelength conversion layer 30 does not enter the interior of the semiconductor light emitting element 10, propagates through the second transparent layer 40, and is extracted directly to the outside; the reabsorption loss due to particularly the light emitting layer 103 of the semiconductor light emitting element 10 is suppressed; heat generation due to the reabsorption is suppressed; and the efficiency increases.

In the light emitting device 220b of the third example, the red fluorescer layer of the first wavelength conversion layer is provided between the semiconductor light emitting element 10 and the mounting member 20; and the first wavelength conversion layer 30 is disposed distal to the green fluorescer layer of the second wavelength conversion layer 80. Therefore, the third light L3, which is a green fluorescence emitted by the second wavelength conversion layer 80, substantially does not reach the first wavelength conversion layer 30. Thereby, the greater part of the green third light L3 emitted by the second wavelength conversion layer 80 is emitted to the outside without being absorbed in the first wavelength conversion layer 30 and the semiconductor light emitting element 10; and a high efficiency is obtained.

Thus, the form of the light emitting device 220 according to this embodiment can be applied to the light emitting device 220b of the third example to provide a light emitting device that emits white light having a high color rendition with high efficiency.

Third Embodiment

Figure 10A:
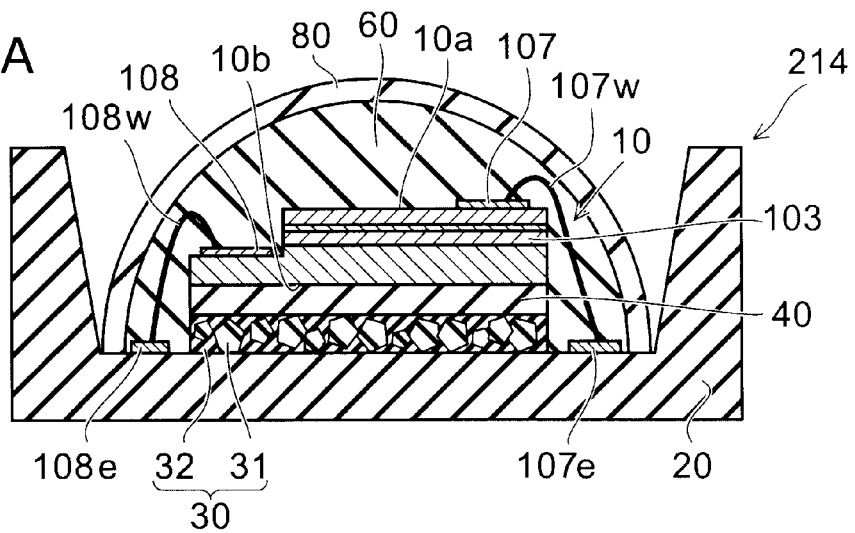
FIG. 10A, FIG. 10B, and FIG. 10C are schematic cross-sectional views illustrating light emitting devices.
Figure 10B:
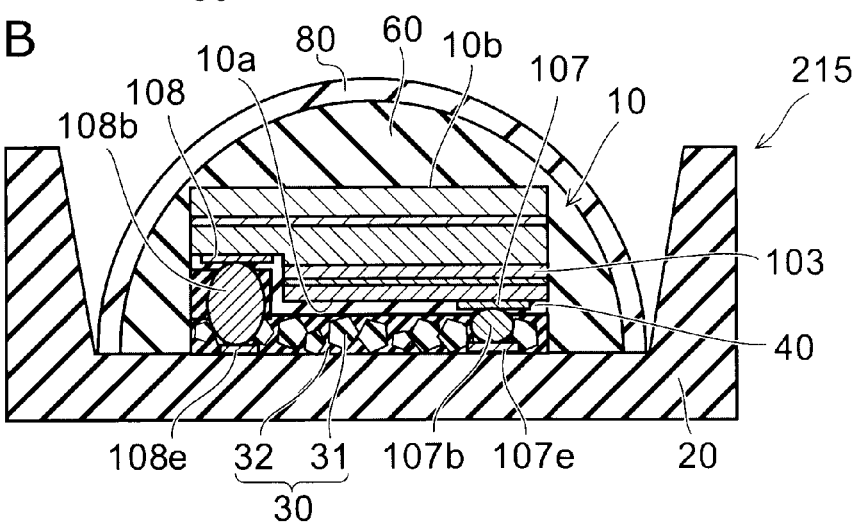
Figure 10C:
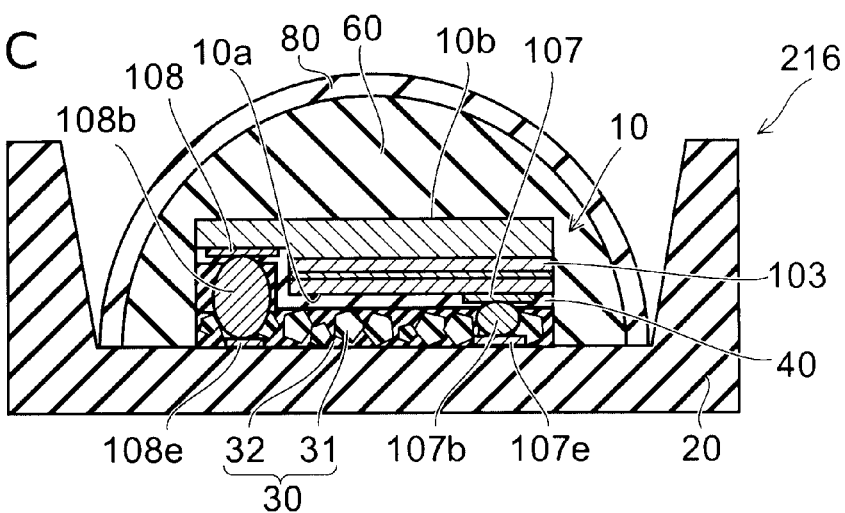

FIG. 10A, FIG. 10B, and FIG. 10C are schematic cross-sectional views illustrating the configurations of light emitting devices according to a third embodiment of the invention.

In a light emitting device 214 according to this embodiment as illustrated in FIG. 10A, the substrate 90 (and the buffer layer 101) of the semiconductor light emitting element 10 are removed; the n-type semiconductor layer (the n-type contact layer 102) of the semiconductor light emitting element 10 contacts the second transparent layer 40; and the first wavelength conversion layer 30 is provided between the second transparent layer 40 and the mounting member 20. Thus, it is sufficient for the semiconductor light emitting element 10 used in the light emitting devices according to the embodiments of the invention to have a configuration including the light emitting layer 103 provided between an n-type semiconductor layer (e.g., the n-type contact layer 102) and a p-type semiconductor layer (e.g., the p-type contact layer 105); and the substrate 90 and the like, for example, may be omitted as necessary.

In the light emitting device 214 as well, the efficiency is increased by providing the second wavelength conversion layer 80, the first transparent layer 60, and the first wavelength conversion layer 30. In this specific example, the efficiency is increased further by providing the second transparent layer 40.

The second transparent layer 40 may be omitted from the configuration of the light emitting device 214. In such a case, the n-type semiconductor layer (the n-type contact layer 102) of the semiconductor light emitting element 10 contacts the first wavelength conversion layer 30.

In another light emitting device 215 according to this embodiment as illustrated in FIG. 10B, the semiconductor light emitting element 10 is mounted on the mounting member 20 such that the p-side electrode 107 and the n-side electrode 108 of the semiconductor light emitting element 10 oppose the mounting member 20. In other words, the first major surface 10a on the p-type semiconductor layer (the p-type contact layer 105) side of the semiconductor light emitting element 10 opposes the mounting member 20. The p-side electrode 107 of the semiconductor light emitting element 10 is electrically connected to the p-side substrate electrode 107e of the mounting member 20 by a p-side bump 107b; and the n-side electrode 108 of the semiconductor light emitting element 10 is electrically connected to the n-side substrate electrode 108e of the mounting member 20 by an n-side bump 108b.

In another light emitting device 216 according to this embodiment as illustrated in FIG. 10C, the substrate 90 (and the buffer layer 101) of the semiconductor light emitting element 10 are removed and the semiconductor light emitting element 10 is mounted on the mounting member 20 such that the p-side electrode 107 and the n-side electrode 108 of the semiconductor light emitting element 10 oppose the mounting member 20.

In the light emitting devices 215 and 216 as well, the efficiency is increased by providing the second wavelength conversion layer 80, the first transparent layer 60, and the first wavelength conversion layer 30. In these specific examples, the efficiency is increased further by providing the second transparent layer 40.

An advantage is provided in the light emitting devices 215 and 216 employing the flip chip structure in that the reliability of the light emitting devices can be increased because the wires (the p-side interconnect 107w and the n-side interconnect 108w) are unnecessary and breakage defects, etc., of the wires occurring due to stress in the first transparent layer 60, etc., do not occur.

The second transparent layer 40 may be omitted from the structures of the light emitting devices 215 and 216. In such a case, the p-type semiconductor layer (the p-type contact layer 105) and a portion of the n-type semiconductor layer (the n-type contact layer 102) of the semiconductor light emitting element 10 contact the first wavelength conversion layer 30. In the case where, for example, a transparent electrode is used as the n-side electrode 108, a structure may be used in which the n-side electrode 108 contacts the first wavelength conversion layer 30.

Figure 11A:
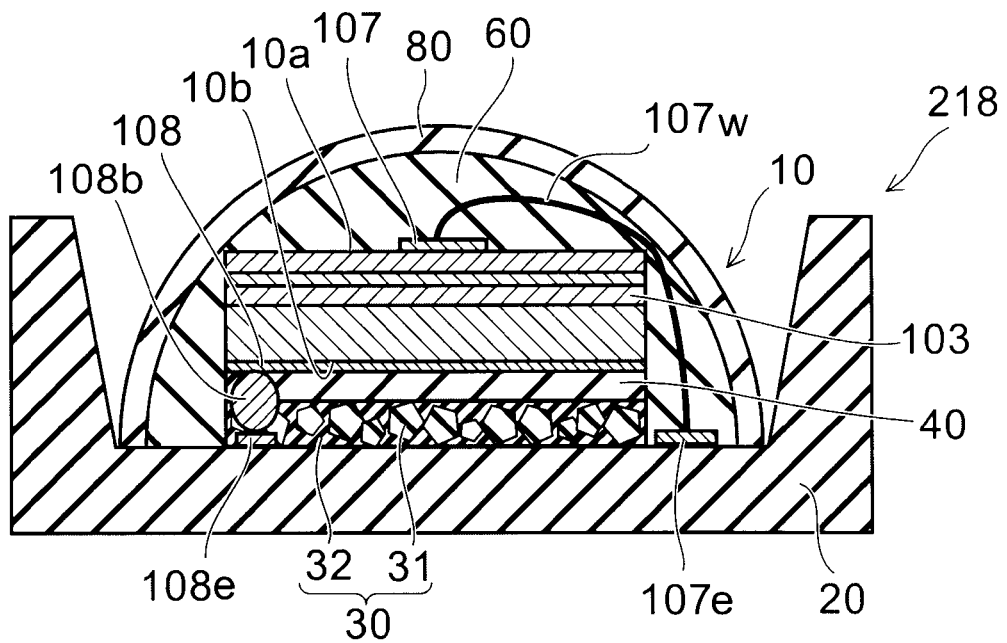
FIG. 11A and FIG. 11B are schematic cross-sectional views illustrating light emitting devices.
Figure 11B:
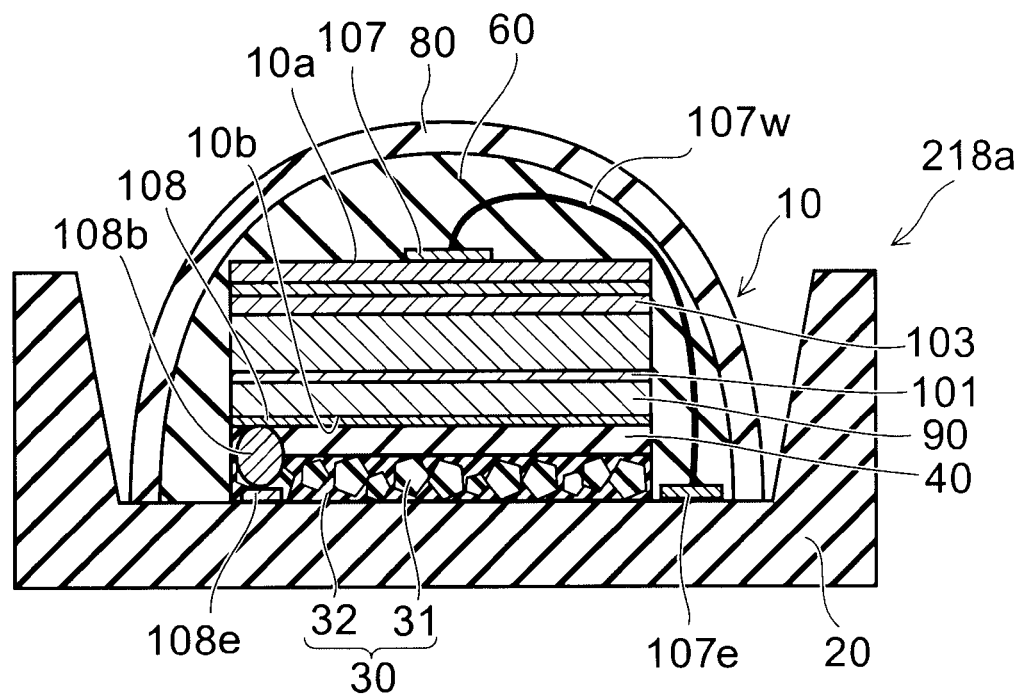

FIG. 11A and FIG. 11B are schematic cross-sectional views illustrating the configurations of other light emitting devices according to the third embodiment of the invention.

In the light emitting device 218 according to this embodiment as illustrated in FIG. 11A, the substrate 90 (and the buffer layer 101) of the semiconductor light emitting element 10 are removed; and the n-side electrode 108 is provided on the second major surface 10b on the n-type semiconductor layer (the n-type contact layer 102) side of the semiconductor light emitting element 10. A transparent electrode, for example, may be used as the n-side electrode 108. The p-side electrode 107 is provided on the first major surface 10a on the p-type semiconductor layer (the p-type contact layer 105) side. The n-side electrode 108 of the semiconductor light emitting element 10 is electrically connected to the n-side substrate electrode 108e of the mounting member 20 by the n-side bump 108b; and the p-side electrode 107 of the semiconductor light emitting element 10 is electrically connected to the p-side substrate electrode 107e of the mounting member 20 by the p-side interconnect 107w.

The second wavelength conversion layer 80 is provided on the side of the semiconductor light emitting element 10 opposite to the first wavelength conversion layer 30; the first transparent layer 60 is provided between the semiconductor light emitting element 10 and the second wavelength conversion layer 80; and the first wavelength conversion layer 30 is provided on the second major surface 10b side of the semiconductor light emitting element 10. In this specific example, the second transparent layer 40 is further provided. The efficiency also increases for the light emitting device 218 having such a configuration.

The second transparent layer 40 may be omitted from such a structure. In such a case, the n-type semiconductor layer (the n-type contact layer 102) of the semiconductor light emitting element 10 contacts the first wavelength conversion layer 30. In the case where, for example, a transparent electrode is used as the n-side electrode 108, a structure may be used in which the n-side electrode 108 contacts the first wavelength conversion layer 30.

In the light emitting device 218a according to this embodiment as illustrated in FIG. 11B, the substrate 90 of the semiconductor light emitting element 10 is electrically conductive; the substrate 90 contacts the second transparent layer 40; and the first wavelength conversion layer 30 is provided between the second transparent layer 40 and the mounting member 20. For example, a SiC substrate is used as the substrate 90. The n-side electrode 108 is provided on the second major surface 10b on the substrate 90 side. The p-side electrode 107 is provided on the first major surface 10a on the p-type semiconductor layer (the p-type contact layer 105) side. The n-side electrode 108 of the semiconductor light emitting element 10 is electrically connected to the n-side substrate electrode 108e of the mounting member 20 by the n-side bump 108b; and the p-side electrode 107 of the semiconductor light emitting element 10 is electrically connected to the p-side substrate electrode 107e of the mounting member 20 by the p-side interconnect 107w.

In such a case as well, the second wavelength conversion layer 80, the first transparent layer 60, and the first wavelength conversion layer 30 are provided; and the second transparent layer 40 is further provided. The efficiency also increases for the light emitting device 218a having such a configuration.

The second transparent layer 40 may be omitted from such a structure. In such a case, the substrate 90 of the semiconductor light emitting element 10 contacts the first wavelength conversion layer 30. In the case where, for example, a transparent electrode is used as the n-side electrode 108, a structure may be used in which the n-side electrode 108 contacts the first wavelength conversion layer 30.

By providing multiple wavelength conversion layers (the first wavelength conversion layer 30 and the second wavelength conversion layer 80) in the light emitting devices 218 and 218a as well, the light emission characteristics of the light emitted by the light emitting devices can be controlled easily; and the desired light emission having high color rendition can be realized more easily.

Thus, in the light emitting device according to the invention, the loss due to returning light reflected by the mounting member 20 being reabsorbed by the light emitting layer 103 of the semiconductor light emitting element 10 can be suppressed by using the first wavelength conversion layer 30 provided on the lower face of the semiconductor light emitting element 10 to perform a wavelength conversion of the first light L1 emitted from the semiconductor light emitting element 10 to the mounting member 20 side and produce the second light L2 having a wavelength longer than the light emission wavelength (the wavelength of the first light L1) of the semiconductor light emitting element 10. The heat dissipation is increased by the first wavelength conversion layer 30 contacting the mounting member 20; the temperature increase of the semiconductor light emitting element 10 is suppressed; and the efficiency is increased.

By providing the first transparent layer 60 on the upper face of the semiconductor light emitting element 10, the reabsorption by the first wavelength conversion layer 30 of the third light L3 emitted by the second wavelength conversion layer 80 is suppressed; and the efficiency is increased. Further, by providing the first transparent layer 60 between the semiconductor light emitting element 10 and the second wavelength conversion layer 80, the distance between the second wavelength conversion layer 80 and the first wavelength conversion layer 30 is increased to further suppress the reabsorption recited above; the increase of the temperature of the semiconductor light emitting element 10 due to the heat generated by the second wavelength conversion layer 80 is suppressed; and the efficiency is increased.

By providing the second transparent layer 40 between the semiconductor light emitting element 10 and the first wavelength conversion layer 30, the light (the first light L1 and the second light L2) reflected by the mounting member 20 can be emitted directly to the outside without passing through the semiconductor light emitting element 10; and the light extraction efficiency is increased. Thereby, a light emitting device having high efficiency can be provided.

Hereinabove, exemplary embodiments of the invention are described with reference to specific examples. However, the invention is not limited to these specific examples. For example, one skilled in the art may similarly practice the invention by appropriate selections from known art, including various modifications made by one skilled in the art in regard to configurations, sizes, material qualities, arrangements, and the like of specific configurations of components included in light emitting devices such as semiconductor light emitting elements, mounting members, first wavelength conversion layers, second wavelength conversion layers, second transparent layers, first transparent layers, semiconductor layers, light emitting layers, electrodes, interconnects, and the like. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all light emitting devices practicable by an appropriate design modification by one skilled in the art based on the light emitting devices described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:
1. A light emitting device, comprising:
a semiconductor light emitting element to emit a first light;
a mounting member, the semiconductor light emitting element being placed on the mounting member;
a first wavelength conversion layer provided between the semiconductor light emitting element and the mounting member in contact with the mounting member, the first wavelength conversion layer absorbing the first light and emitting a second light having a wavelength longer than a wavelength of the first light;
a second wavelength conversion layer, the semiconductor light emitting element being disposed between at least a part of the second wavelength conversion layer and the first wavelength conversion layer, the second wavelength conversion layer absorbing the first light and emitting a third light having a wavelength longer than the wavelength of the first light; and
a first transparent layer provided between the semiconductor light emitting element and the second wavelength conversion layer, the first transparent layer being transparent to the first light, the second light, and the third light.
2. The device according to claim 1, wherein the wavelength of the third light is not longer than the wavelength of the second light.

3. The device according to claim 1, further comprising a second transparent layer provided between the semiconductor light emitting element and the first wavelength conversion layer in contact with the semiconductor light emitting element and the first wavelength conversion layer, the second transparent layer being transparent to the first light and the second light.

4. The device according to claim 3, wherein
a refractive index of a portion of the semiconductor light emitting element contacting the second transparent layer is higher than a refractive index of the second transparent layer, and
a refractive index of a portion of the first wavelength conversion layer contacting the second transparent layer is not higher than the refractive index of the second transparent layer.

5. The device according to claim 1, wherein
the first wavelength conversion layer includes a first wavelength conversion particle dispersed in a resin, the first wavelength conversion particle absorbing the first light and emitting the second light, and
a particle size of the first wavelength conversion particle is not less than 1 micrometer and not more than 50 micrometers.

6. The device according to claim 5, wherein the first wavelength conversion particle includes at least one selected from a fluorescer fine particle and a nitride semiconductor fine particle.

7. The device according to claim 5, wherein the resin having the first wavelength conversion particle dispersed in the resin includes a silicone-based resin.

8. The device according to claim 1, wherein the first wavelength conversion layer bonds at least a portion of the semiconductor light emitting element to at least a portion of the mounting member.

9. The device according to claim 1, wherein
the second wavelength conversion layer includes a second wavelength conversion particle dispersed in a resin, the second wavelength conversion particle absorbing the first light and emitting the third light, and
the second wavelength conversion particle includes at least one selected from a fluorescer fine particle and a nitride semiconductor fine particle.

10. The device according to claim 9, wherein the resin having the second wavelength conversion particle dispersed in the resin includes a silicone-based resin.

11. The device according to claim 1, wherein at least a portion of an end portion of the second wavelength conversion layer contacts the mounting member.

12. The device according to claim 1, wherein the first transparent layer covers the semiconductor light emitting element, and an exterior surface of the first transparent layer has a curved configuration protruding along a direction from the mounting member toward the semiconductor light emitting element.

13. The device according to claim 1, wherein at least a portion of an end portion of the first transparent layer contacts the mounting member.

14. The device according to claim 1, wherein the first transparent layer includes a layer including a gas.

15. The device according to claim 1, wherein at least one selected from the first wavelength conversion layer and the second wavelength conversion layer includes at least one selected from the group consisting of silicone resin, epoxy resin, polydimethylsiloxane derivative having an epoxy group, oxetane resin, acrylic resin, cycloolefin resin, urea resin, fluorocarbon resin, and polyimide resin.

16. The device according to claim 1, wherein
the second wavelength conversion layer includes:
a first fluorescer layer; and
a second fluorescer layer stacked with the first fluorescer layer on a side of the semiconductor light emitting element of the first fluorescer layer,
a light emission wavelength of the first fluorescer layer being shorter than a light emission wavelength of the second fluorescer layer.

17. The device according to claim 1, wherein the first light is blue light, the second light is yellow light, and the third light is yellow light.

18. The device according to claim 1, wherein the first light is blue light, the second light is red light, and the third light is green light.

19. The device according to claim 1, wherein the first light is near-ultraviolet light, the second light is red light, and the third light is blue and green light.

20. The device according to claim 1, wherein the mounting member includes a reflective film provided on a face of the mounting member on a side of the semiconductor light emitting element.

* * * * *